(12) United States Patent
Nishimura et al.

(10) Patent No.: US 7,164,277 B2
(45) Date of Patent: Jan. 16, 2007

(54) METHOD FOR CIRCUIT INSPECTION (75) Inventors: Toshiro Nishimura, Kariya (JP); Hideki Kabune, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/402,900

(22) Filed: Apr. 13, 2006

(65) Prior Publication Data
US 2006/0232283 A1 Oct. 19, 2006

(30) Foreign Application Priority Data
Apr. 13, 2005 (JP) .............................. 2005-116295

(51) Int. Cl.
G01R 27/08 (2006.01)
(52) U.S. Cl. .................... 324/718; 324/158.1
(58) Field of Classification Search ............. 324/153.1, 324/713
See application file for complete search history.

(56) References Cited

U.S. PATENT DOCUMENTS 5,659,257 A * 8/1997 Lu et al. ..................... 324/763
5,721,495 A * 2/1998 Jennion et al. ............. 324/765
5,901,096 A    5/1999 Inokuchi et al.
6,801,050 B1 * 10/2004 Takechi et al. ............. 324/765

FOREIGN PATENT DOCUMENTS

| JP | A-5-72280 | 3/1993 |
| JP | A-11-258307 | 9/1999 |
| JP | A-2002-40113 | 2/2002 |

* cited by examiner

Primary Examiner—Walter Benson
(74) Attorney, Agent, or Firm—Posz Law Group, PLC (57) ABSTRACT A method for inspecting an electronic circuit formed on a board with a peripheral circuit includes steps of providing a terminal for inputting and outputting an electronic signal, providing an impedance increase means for increasing an impedance of an electrical connection between the electronic circuit and the peripheral circuit and providing an inspection means for inspecting the electronic circuit. The impedance of the electronic circuit is increased to prevent influence of the peripheral circuit before and during inspection of the electronic circuit, and the increase of the impedance is removed after the inspection.

10 Claims, 5 Drawing Sheets

METHOD FOR CIRCUIT INSPECTION

CROSS REFERENCE TO RELATED APPLICATION

This application is based on and claims the benefit of priority of Japanese Patent Application No. 2005-116295 filed on Apr. 13, 2005, the disclosure of which is incorporated herein by reference.

FIELD OF THE INVENTION

The present invention generally relates to a circuit inspection method.

BACKGROUND OF THE INVENTION

Conventionally, electronic circuits on a substrate are implemented by using a packaged (resin sealed) ICs and microcomputers because of their ease of handling and resistivity to environmental influence. However, demand for high functionality and more complicated system in electronic control units (ECUs) urges increase of the scale of the electronic circuits, in spite of a limited space reserved for the ECUs.

The limitation imposed on the ECUs drives reduction in volume of the electronic circuits by using smaller ICs (packaged parts, chip-size packages, bare chips [IC chips without resin seal] or the like). In this case, reduced spacing between the terminals and/or decreased size of the terminals on the smaller ICs make it more difficult to perform quality inspection by contacting the terminals.

Japanese Patent Document JP-A-H5-72280 discloses an electronic circuit inspection method for quality assurance that inspects the electronic circuits in a state of implementation on a board. However, the electronic circuit implemented on the board has peripheral circuits connected thereto, thereby receiving influence from the peripheral circuits during inspection and having inaccuracy in inspection result. That is, critical inspections in terms of product quality such as leakage current inspection, function inspection or the like cannot be performed on the electronic circuit in the state of implementation on the board.

SUMMARY OF THE INVENTION

In view of the above-described and other problems, the present invention provides a method for inspecting an electronic circuit in a state of implementation on a board without having influence from other circuits that are not included in inspection.

The inspection method of the present invention for inspecting an electronic circuit disposed on a board includes steps of providing a terminal for inputting and outputting an electronic signal to/from the electronic circuit, providing a peripheral circuit, providing an impedance increase unit for increasing an impedance of an electrical connection between the electronic circuit and the peripheral circuit, and providing a inspection unit for inspecting the electronic circuit. The impedance increase unit performs inflow prevention process of an electric current from the peripheral circuit into the electronic circuit and/or outflow prevention process of the electric current from the electronic circuit to the peripheral circuit before performing inspection process of the electronic circuit with the inspection unit. The inspection unit performs the inspection process of the electronic circuit by electrically coupling the terminal with the inspection unit and either providing inspection signal for or receiving inspection signal from the electronic circuit. The impedance increase unit performs electrical coupling process between the electronic circuit and the peripheral circuit after the inspection process.

The subject electronic circuit to be inspected can avoid influence of other circuits by increasing impedance of the subject electronic circuit itself relative to the peripheral circuit. In this manner, leak current inspection or function inspection of the electronic circuit can be performed in a state of implementation on the board.

The method for inspecting the electronic circuit formed on a board can also be described as conditions of electronic circuits in relation with the peripheral circuit. That is, the inflow/outflow of the electric current to/from the electronic circuit is prevented by increasing impedance of the electronic circuit with the impedance increase unit as an initial condition, and electric current shutoff condition is kept maintained during the inspection. The inspection signal is provided to the terminal from the inspection unit during the inspection. The impedance of the electronic circuit is lowered after the inspection to have the electrical coupling between the electronic circuit and the peripheral circuit.

The third version of the description of the inspection is more direct than the former ones. The inspection of the electronic circuit is executed by increasing the impedance of the electronic circuit with the impedance increase unit in the first place, and inspection signal is provided to the circuit with the increased impedance maintained in the same level. After the inspection, the impedance is lowered to resume the electrical connection between the electronic circuit and the peripheral circuit.

In another aspect of the present invention, the impedance increase unit is provided as a switch. For example, a MOS switch may be used to securely increase the impedance of the electronic circuit by using a small control current in a simple circuit structure without causing a leak current.

In still another aspect of the present invention, the impedance increase unit may be provided by omitting a circuit wiring between the electronic circuit and the peripheral circuit for electrical coupling. That is, the impedance of the electrical coupling between pads is controlled without using the switch or the like when the circuit wiring between the pads is not disposed.

In still yet another aspect of the present invention, the impedance of the electronic circuit may be increased by disposing a diode in a manner that prevents the inflow of the electric current from the peripheral circuit into the electronic circuit and/or the outflow of the electric current from the electronic circuit to the peripheral circuit. In this manner, the electronic circuit can be shipped as a completed product after the inspection without any processing of wiring. Further, the characteristic of the diode disposed in an IC of the peripheral circuit can easily be changed after the inspection for controlling the impedance.

In still yet another aspect of the present invention, the increase of the impedance may be provided by using a three-state circuit that selectively cuts off the electric current from either of a power supply, a ground (GND), or the peripheral circuit for the electronic circuit in a first, a second or a third state of operation. In this manner, the electronic circuit can be inspected as a completed product because the wiring is not necessarily processed after the inspection.

In still yet another aspect of the present invention, the increase of the impedance is provided by not disposing wiring between a first pad and a second pad that are respectively connected to bundles of equipotential circuit wiring. In this manner, the number of pads for increasing the impedance is decreased.

In still yet another aspect of the present invention, the electronic circuit and the peripheral circuit are disposed on a same board. In this manner, the object of the inspection, i.e., the electronic circuit, and the peripheral circuit are implemented on the same board to be inspected as an almost completed product for achieving an improved product quality.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENTS

Embodiments of the present invention are described with reference to the drawings.

Figure 1:
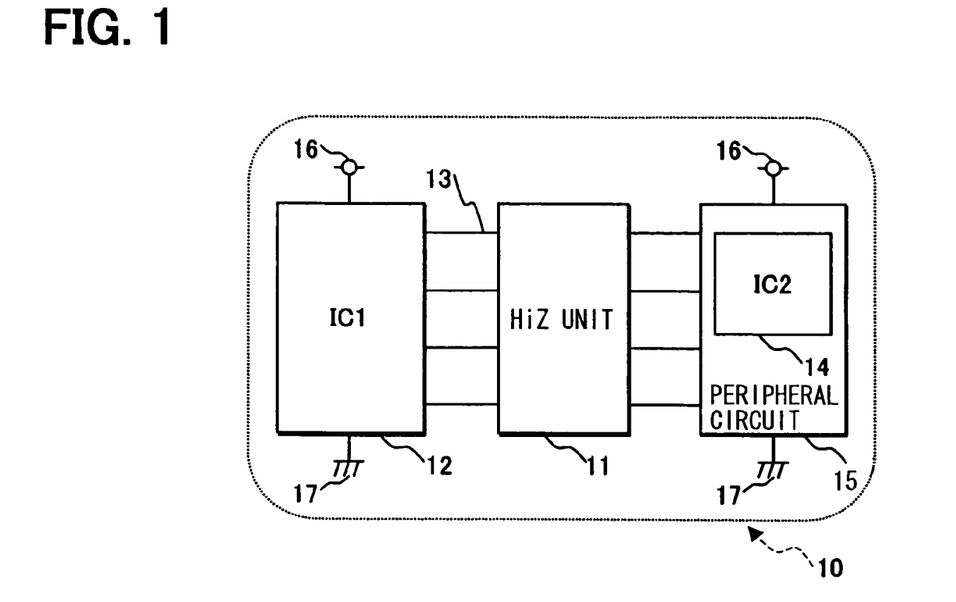
FIG. 1 shows a block diagram of a circuit configuration on a board regarding an embodiment of the present invention.

FIG. 1 shows a block diagram of a circuit configuration on a board 10 regarding an embodiment of the present invention. How impedance of a part of the circuit is increased by an impedance increase unit (HiZ unit) 11 in relation to an inspection of an IC on the board is a focus of the present invention.

The board 10 has the IC1 12 implemented thereon as a test object, and each terminal on the IC1 12 is connected to the HiZ unit 11 through a wiring 13. An IC2 14 and a pull-down resistor or the like are also connected to the IC1 12 through another wiring 13. In addition, a power source 16 and a GND 17 are connected to the IC1 12 and IC2 14 for providing driving current. In this case, the IC2 14, the power source 16, the GND 17, electric elements such as the pull-down resistor and the like are categorized as a peripheral circuit 15. The impedance of the IC1 12 is increased by using the HiZ unit 11 on each of the terminals of the IC1 12 for performing inspections such as leak tests and function tests. In this manner, an inflow/outflow of the electric current between the IC1 12 and the peripheral circuit 15 is prevented. The HiZ unit 11 applied in a practical circuit is described in the following description.

First Embodiment

Figure 2:
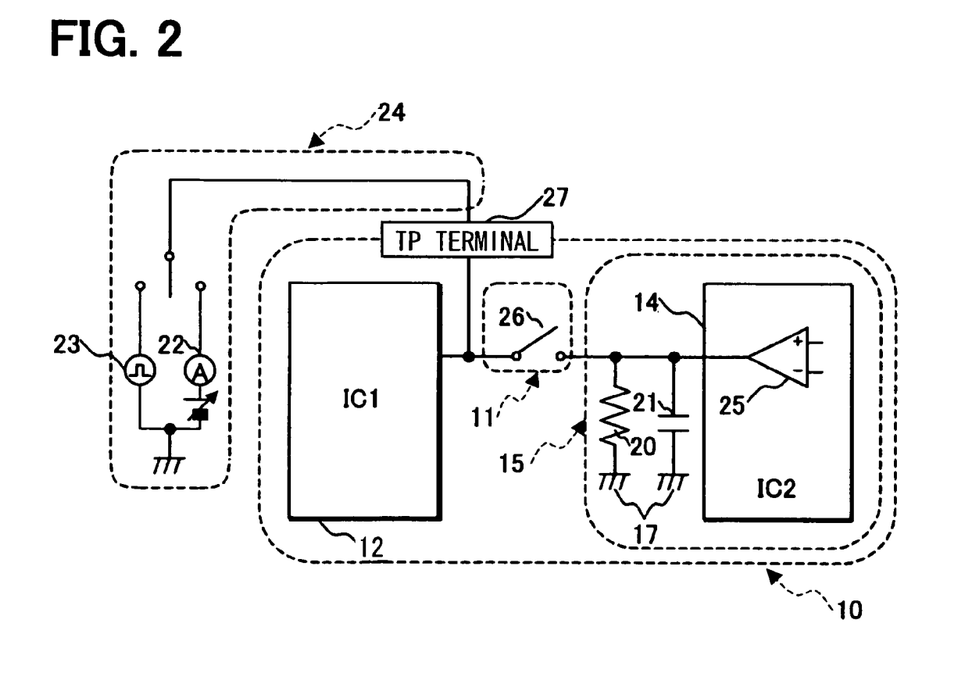
FIG. 2 shows a schematic diagram of the circuit configuration on the board in a first embodiment.

FIG. 2 shows a schematic diagram of the circuit configuration on the board 10 in a first embodiment. In the present embodiment, the IC1 12 as the test object is connected a switch 26 that constitutes the HiZ unit 11, and the peripheral circuit 15 that includes the IC2 14, a pull-down resistor 20, a condenser 21 on the board 10 as well as an insulation unit 24, an ammeter 22 and a signal generator 23 for testing the test object.

The pull-down resistor 20 and the condenser 21 are connected to the IC1 12 through the wiring 13, and the IC2 14 includes an analog output circuit such as an operational amplifier (Op. Amp) 25 as shown in FIG. 2. The IC1 12 is in connection with the pull-down resistor 20, the condenser 21, and the IC2 14 by the switch 26 as the HiZ unit 11. In the following embodiments, the pull-down resistor 20 and the condenser 21 are connected to the GND 17 unless otherwise designated. Also, the IC1 12 has a TP terminal 27 for connecting external devices such as an inspection unit 24.

Test procedure for the IC1 12 is described in the following description.

The IC1 12 is electrically isolated from the peripheral circuit 15 by operating the switch 26 as HiZ unit 11. The influence from the peripheral circuit 15 is prevented in this manner. Then, the TP terminal 27 is used to connect the inspection unit 24 to the IC1 12 for the leak inspection and the function inspection without having the influence from the peripheral circuit 15.

The switch 26 may be provided as a mechanical switch or may be provided as a semiconductor switch by using a semiconductor element such as a p-MOS, an n-MOS or an analog switch.

Second Embodiment

Figure 3:
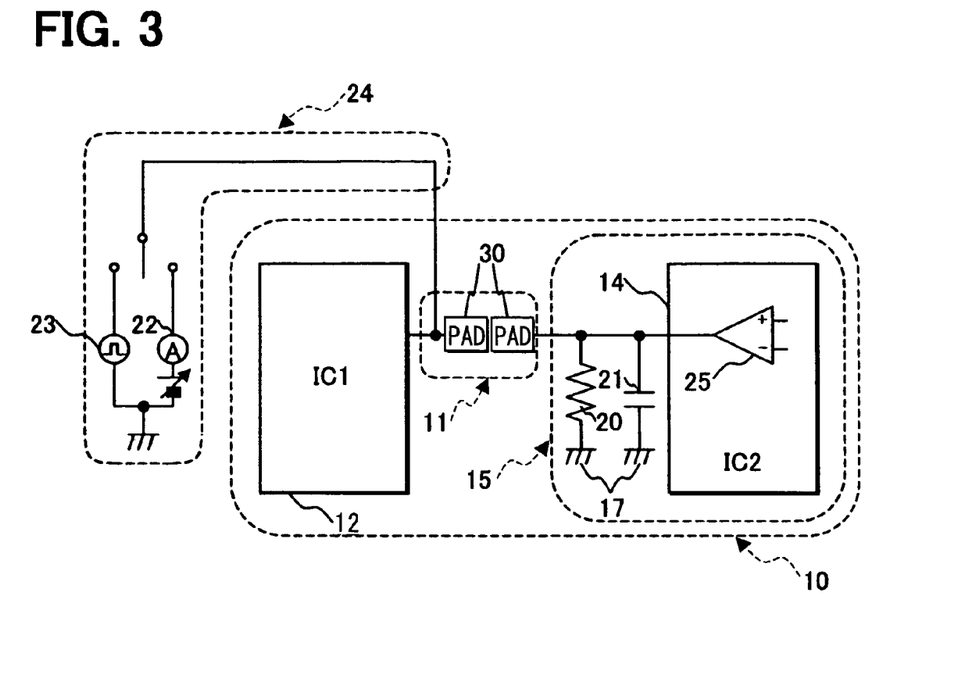
FIG. 3 shows a schematic diagram of the circuit configuration on the board in a second embodiment.

FIG. 3 shows a schematic diagram of the circuit configuration on the board in a second embodiment. Difference between the present embodiment and a previous embodiment exists in that the HiZ unit 11 is provided by omitting the wiring. In the present embodiment, like parts have like numerals as the previous embodiment and descriptions of the like parts are omitted.

The increase of the impedance in the present embodiment is arranged by not disposing the wiring 13 between two pads 30 that are used in place of the switch 26 as shown in FIG. 3. In this manner, the impedance is increased without adding any extra circuit such as the switch 26 to have a same effect as the first embodiment. Further, the pads 30 are utilized as TP terminals 27 during the inspection. The two pads 30 are electrically connected after the inspection. In this manner, the number of TP terminals 27 is decreased.

Third Embodiment

Figure 4:
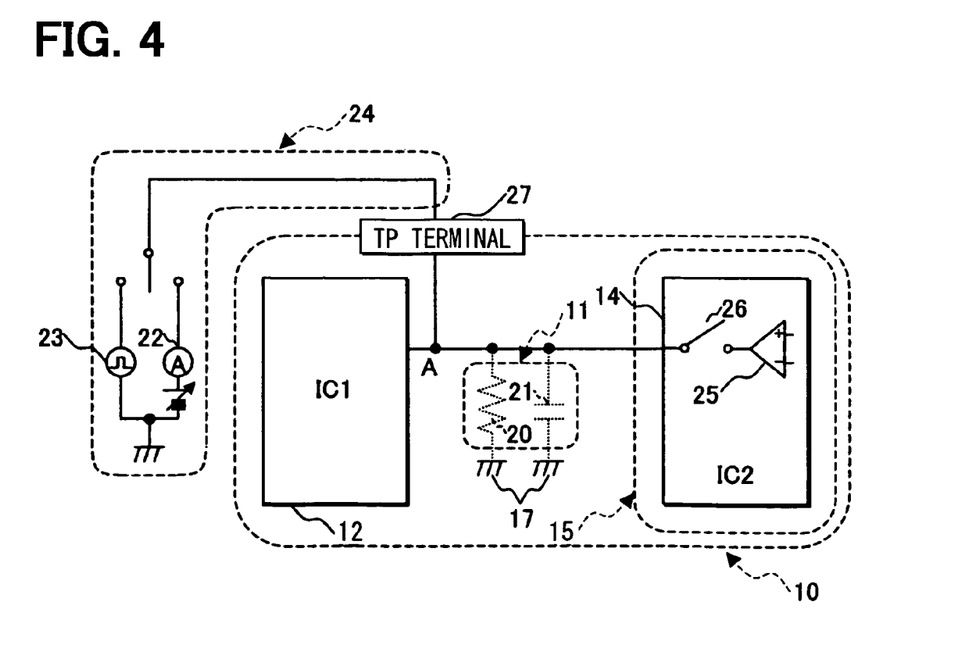
FIG. 4 shows a schematic diagram of the circuit configuration on the board in a third embodiment.

FIG. 4 shows a schematic diagram of the circuit configuration on the board in a third embodiment. Difference between the present embodiment and previous embodiments exists in that the pull-down resistor 20 and the condenser 21 are implemented on the board 10 after the inspection, and the switch 26 is disposed between the IC1 12 and the Op. Amp 25 in the IC2 14. In the present embodiment, like parts have like numerals as the previous embodiment and descriptions of the like parts are omitted.

The IC1 12 is isolated from the GND 17 by not disposing the condenser 21 and the resistor 20, and the switch 26 in the IC2 14 is used to isolate the Op. Amp 25 from the IC1 12 to increase the impedance and shut the influence from the peripheral circuit 15 as shown in FIG. 4. Then, the TP terminals 27 are used to input inspection signal. After the inspection, the condenser 21, the resistor 20 are implemented on the board 10. In this manner, the influence from the peripheral circuit 15 including the IC2 14, the GND 17 or the like is prevented during the inspection of the IC1 12. Any extra circuitry or the like is not required on the board 10 for performing the inspection.

In this case, the switch 26 may be disposed on a portion of the wiring toward a point A instead of an inside of the IC2 14. The parts used to isolate the IC1 12 may not necessarily be the condenser 21 and the resistor 20. That is, other electronic parts may be kept un-implemented on the board 10 during the inspection.

Fourth Embodiment

Figure 5:
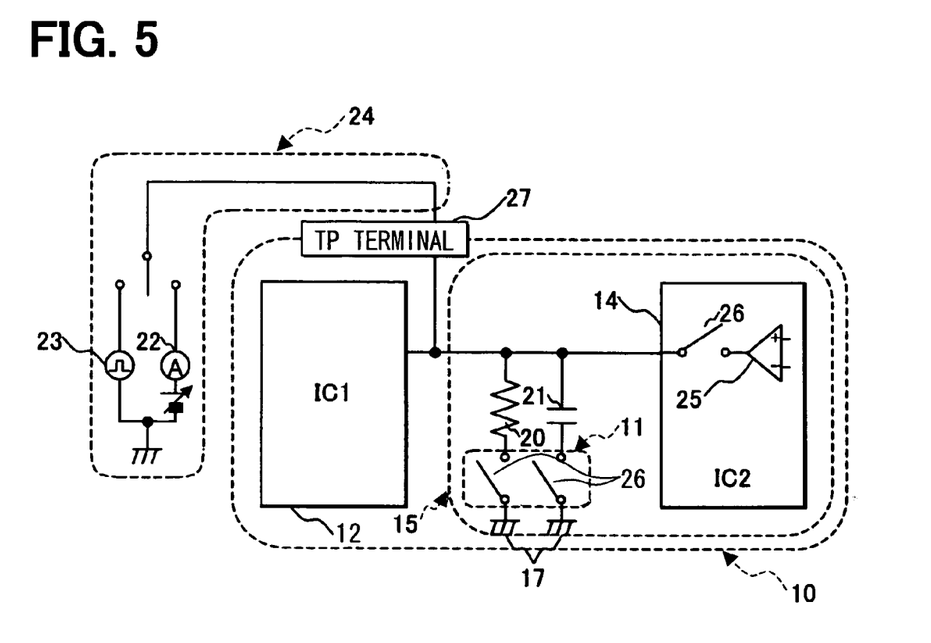
FIG. 5 shows a schematic diagram of the circuit configuration on the board in a fourth embodiment.

FIG. 5 shows a schematic diagram of the circuit configuration on the board in a fourth embodiment. Difference between the present embodiment and a previous embodiment exists in that the switches 26 are disposed between the pull-down resistor 20/the condenser 21 and the GND 17 respectively. In the present embodiment, like parts have like numerals as the previous embodiment and descriptions of the like parts are omitted.

The switch 26 between the resistor 20 and the GND 17, and the switch 26 between the condenser 21 and the GND 17 are respectively turned off to isolate the resistor 20/the condenser 21 from the GND 17 as shown in FIG. 5. The switch 26 being turned off during the inspection can increase the impedance, and the switch 26 is turned on to connect the IC1 12 to the GND 17 after the inspection. In this manner, the influence of the peripheral circuit is prevented during the inspection. That is, the present embodiment has the same effect as the previous embodiment.

The switch 26 may be provided as a mechanical switch or may be provided as a semiconductor switch by using a semiconductor element such as the p-MOS, the n-MOS or an analog switch.

Fifth Embodiment

Figure 6:
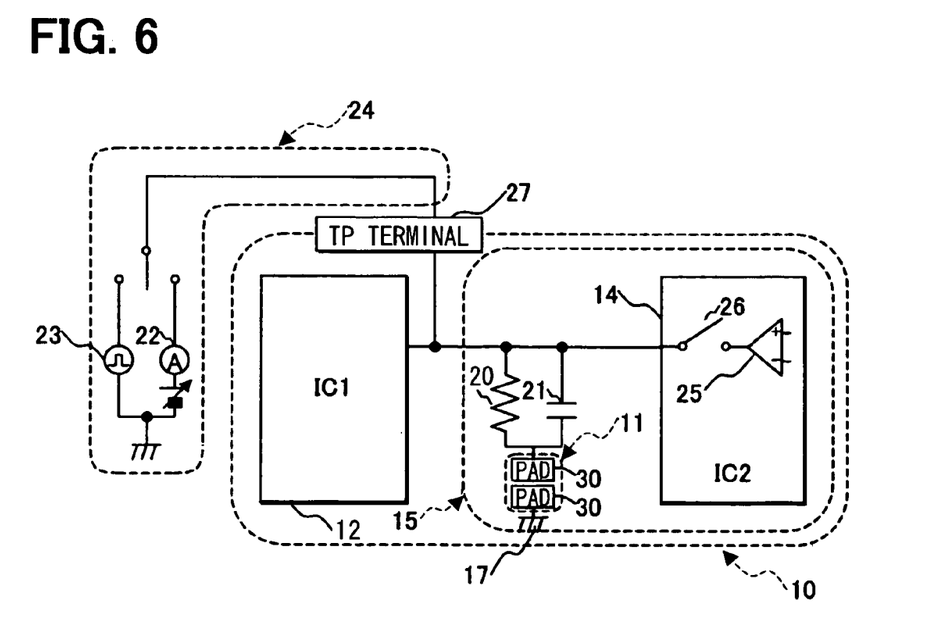
FIG. 6 shows a schematic diagram of the circuit configuration on the board in a fifth embodiment.

FIG. 6 shows a schematic diagram of the circuit configuration on the board in a fifth embodiment. Difference between the present embodiment and a previous embodiment exists in that the wiring 13 is not disposed between the pull-down resistor 20/the condenser 21 and the GND 17 respectively. In the present embodiment, like parts have like numerals as the previous embodiment and descriptions of the like parts are omitted.

The switch 26 disposed between the resistor 20/the condenser 21 and the GND 17 is replaced with the two pads 30, and the isolation of the resistor 20/the condenser 21 from the GND 17 is established by not connecting the two pads 30. The two pads 30 are short-circuited by the wiring 13 or bonding after the inspection by using the TP terminals 27. The wirings 13 having equipotential voltage are connected to a single pad 30 in a bundle as shown in FIG. 6 to have a fewer number of the pads 30. In this manner, the present invention achieves reduced steps of processes and parts cost for bonding or re-wiring after the inspection and reduced size of the circuit in addition to the effect expected in the fourth embodiment.

Sixth Embodiment

Figure 7:
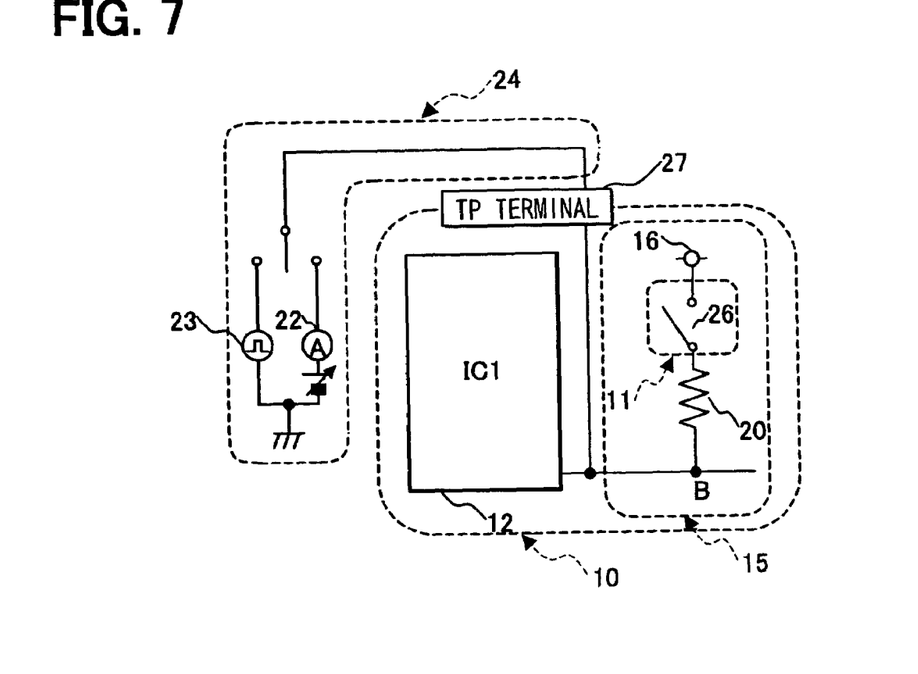
FIG. 7 shows a schematic diagram of the circuit configuration on the board in a sixth embodiment.

FIG. 7 shows a schematic diagram of the circuit configuration on the board in a sixth embodiment. Difference between the present embodiment and previous embodiments exists in that the IC1 12 has an external power supply 16. In the present embodiment, like parts have like numerals as the previous embodiment and descriptions of the like parts are omitted.

The IC1 12 has the power supply 16 provided thereto from outside. In this case, the switch 26 is provided between the power supply 16 and the pull-up resistor 20 as the HiZ unit 11. In this manner, a simple structure for shutting the electric current from/to the peripheral circuit 15 is provided. The switch 26 may be disposed in a section between the pull-up resistor 20 and a point B instead of a section between the power source 16 and the pull-up resistor 20.

Seventh Embodiment

Figure 8:
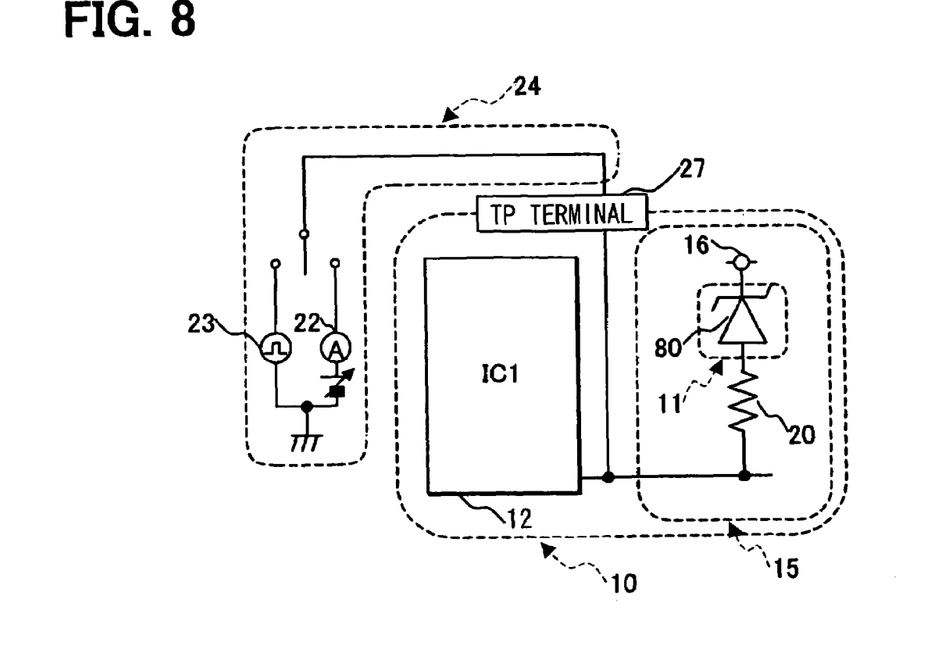
FIG. 8 shows a schematic diagram of the circuit configuration on the board in a seventh embodiment.

FIG. 8 shows a schematic diagram of the circuit configuration on the board in a seventh embodiment. Difference between the present embodiment and a previous embodiment exists in that a zener diode 80 is used as the HiZ unit 11. In the present embodiment, like parts have like numerals as the previous embodiment and descriptions of the like parts are omitted.

The zener diode 80 used in place of the switch 26 as the HiZ unit 11 is shown in FIG. 8. In this case, the zener diode 80 cannot be used if the inspection applies a voltage VTP that is greater than a threshold voltage Vf of the zener diode 80 to the TP terminal 27, because the voltage VTP greater than the Vf causes a wrap-around current toward the power supply 16. The inspection can appropriately be performed if the circuit configuration allows the voltage V23 of the power supply 16. That is, the inspection can be performed when the voltage V23 is set to be greater than addition of the voltage of VTP and Vf.

In this manner, the electric current from the power supply 16 (i.e., the peripheral circuit 15) is prevented by only using a single piece of the zener diode 80.

Eighth Embodiment

Figure 9:
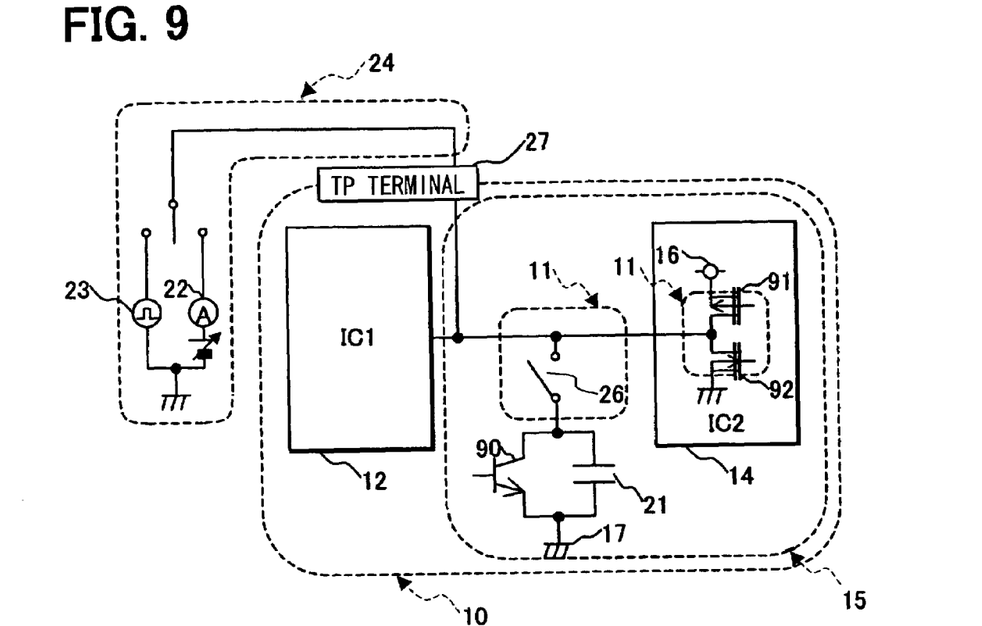
FIG. 9 shows a schematic diagram of the circuit configuration on the board in an eighth embodiment.

FIG. 9 shows a schematic diagram of the circuit configuration on the board in an eighth embodiment. Difference between the present embodiment and previous embodiments exists in that a three state digital output circuit is used in the IC 2 14. In the present embodiment, like parts have like numerals as the previous embodiment and descriptions of the like parts are omitted.

The IC1 12 is connected to condenser 21 and a transistor 90, and the IC2 14 has a digital output circuit of CMOS or the like formed therein as shown in FIG. 9. The condenser 21 and the transistor 90 are isolated from the IC1 12 by the switch 26. The impedance of the circuit of the present invention is increased in three states by using a circuit having a p-MOS 91 and an n-MOS 92 (i.e., a push-pull circuit). That is, an H state having an output voltage from the power supply 16, an L state having an output voltage from the GND 17, and a HiZ state that is categorized to neither of the previous states are the states being expected. The inspection of the IC1 12 is performed in the HiZ state by connecting the inspection unit 24 to the TP terminals 27. The HiZ state of the push-pull circuit is released and the switch 26 is turned on after the inspection. The three state push-pull circuit can be formed in the IC2 14 without having any influence in the peripheral circuit 15 on the board 10.

The push-pull circuit may increase the impedance only when the push-pull circuit has a signal input (i.e., an inspection signal or the like). The switch 26 may be replaced with the pads 30 for isolation of the transistor 90 and the condenser 21 from the IC1 12 as shown in FIGS. 3 and 6.

Ninth Embodiment

Figure 10:
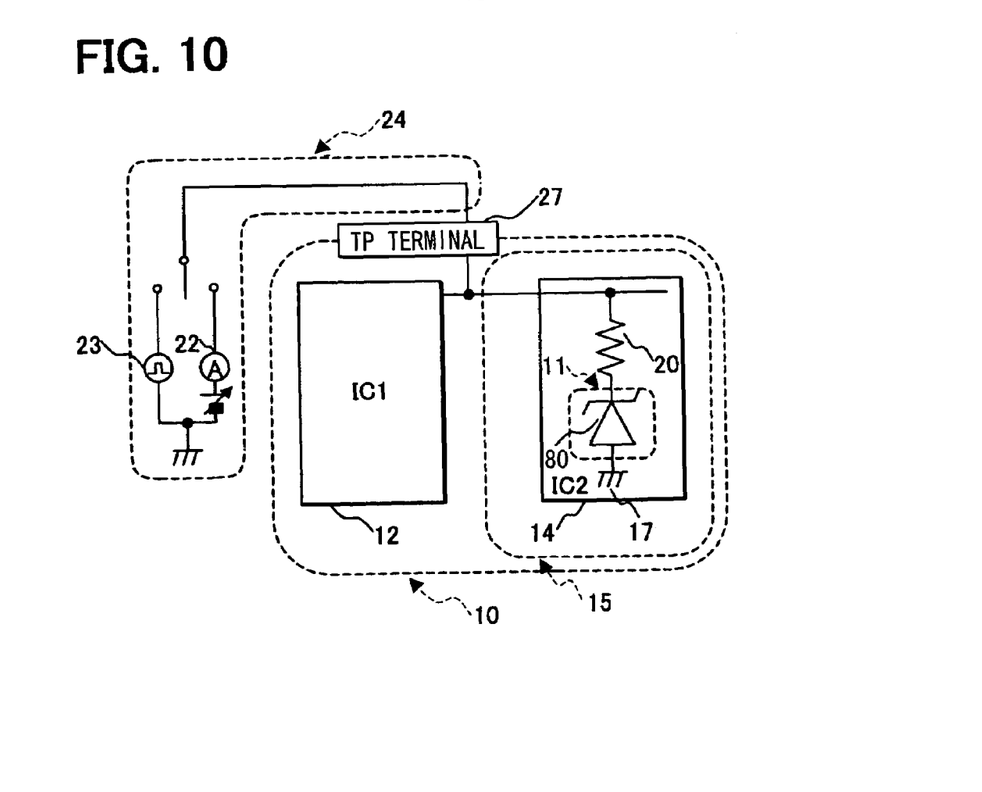
FIG. 10 shows a schematic diagram of the circuit configuration on the board in a ninth embodiment.

FIG. 10 shows a schematic diagram of the circuit configuration on the board in a ninth embodiment. Difference between the present embodiment and previous embodiments exists in that the HiZ unit 11 having the pull-down resistor 20 and the zener diode 80 is formed in the IC2 14. In the present embodiment, like parts have like numerals as the previous embodiment and descriptions of the like parts are omitted.

The IC1 12 is connected to the IC2 14, and the pull-down resistor 20 is formed in the IC2 14. The zener diode 80 is disposed between the GND 17 and the pull-down resistor 20 for isolating the resistor 20 in the IC2 14 from the GND 17 in the IC2 14. Disposing the zener diode 80 increases the impedance and prevents influence of the pull-down resistor 20 on the IC2 14. The inspection of the IC1 12 is performed in this state of increased impedance by connecting the inspection unit 24 to the TP terminals 27. The inspection cannot appropriately be performed if the voltage applied to the TP terminals 27 is greater than a breakdown voltage VB of the zener diode 80. The zener diode 80 can be short-circuited after performing the inspection by zapping (adjustment process in terms of resistance/voltage characteristic applied for a semiconductor in a manufacturing process by using a laser), thereby enabling removal of the influence of the zener diode 80 on a normal operation of the IC2 14.

The zener diode 80 of the present embodiment may be replaced with the switch 26 that is shown in FIG. 7.

Although the present invention has been fully described in connection with the preferred embodiments thereof with reference to the accompanying drawings, it is to be noted that various changes and modifications will become apparent to those skilled in the art. Such changes and modifications are to be understood as being within the scope of the present invention as defined by the appended claims.

What is claimed is:

1. A method for inspecting an electronic circuit formed on a board with a peripheral circuit comprising steps of:
   providing a terminal for inputting and outputting an electronic signal;
   providing an impedance increase means for increasing an impedance of an electrical connection between the electronic circuit and the peripheral circuit; and
   providing an inspection means for inspecting the electronic circuit,
   wherein the impedance increase means performs inflow prevention process of an electric current from the peripheral circuit into the electronic circuit and/or outflow prevention process of the electric current from the electronic circuit to the peripheral circuit before performing inspection process of the electronic circuit with the inspection means,
   the inspection means performs the inspection process of the electronic circuit by electrically coupling the terminal with the inspection means and by performing input and output of inspection signal between the inspection means and the electronic circuit, and
   the impedance increase means performs electrical coupling process between the electronic circuit and the peripheral circuit after the inspection process.

2. The method according to claim 1,
   wherein the impedance increase means is provided by utilizing a switch.

3. The method according to claim 1,
   wherein the impedance increase means is provided by omitting a circuit wiring for electrically coupling the electronic circuit with the peripheral circuit.

4. The method according to claim 3,
   wherein the impedance increase means has a bundle of the circuit wiring that is equipotentially connected to a first pad, and
   the peripheral circuit has a bundle of the circuit wiring that is equipotentially connected to a second pad being in isolation from the first pad.

5. The method according to claim 1,
   wherein the impedance increase means is provided by utilizing a diode in a manner that prevents the inflow of the electric current from the peripheral circuit into the electronic circuit and/or the outflow of the electric current from the electronic circuit to the peripheral circuit.

6. The method according to claim 1,
   wherein the impedance increase means is provided by utilizing a three-state circuit that provides a power level in a first state of operation, a ground level in a second state of operation, and separation of the peripheral circuit from the electronic circuit in a third state of operation.

7. The method according to claim 1,
   wherein the electronic circuit and the peripheral circuit are disposed on a same board.

8. A method for inspecting an electronic circuit formed on a board with a peripheral circuit comprising steps of:
   providing a terminal for inputting and outputting an electronic signal;
   providing an impedance increase means for increasing an impedance of an electrical connection between the electronic circuit and the peripheral circuit; and
   providing an inspection means for inspecting the electronic circuit,
   wherein the impedance increase means prevents inflow of an electric current from the peripheral circuit into the electronic circuit and/or outflow of the electric current from the electronic circuit to the peripheral circuit with a provision of an inspection signal shutoff state to the electronic circuit by the inspection means,
   the impedance increase means maintains prevention of the inflow of an electric current from the peripheral circuit into the electronic circuit with a provision of an inspection signal provision state to the electronic circuit by the inspection means in an electrical coupling with the terminal, and
   the impedance increase means provides an electrical connection between the electronic circuit and the peripheral circuit with a provision of the inspection signal shutoff state to the electronic circuit by the inspection means.

9. A method for inspecting an electronic circuit implemented on a board with a peripheral circuit by using an inspection means comprising steps of:
   providing an impedance increase means; and
   providing a terminal,
   wherein the impedance increase means is utilized to prevent inflow of an electric current from the peripheral circuit into the electronic circuit and/or outflow of the electric current from the electronic circuit to the peripheral circuit before inspection, the inspection means is utilized to provide an inspection signal to the electronic circuit with an electrical coupling between the electronic circuit and the inspection means through the terminal in addition to an utilization of the impedance increase means for maintaining prevention of the inflow of an electric current from the peripheral circuit into the electronic circuit during the inspection, and the impedance increase means is utilized to provide the electrical coupling between the electronic circuit and the peripheral circuit after the inspection.

10. An inspection system for inspecting an electronic circuit disposed on a board with a peripheral circuit comprising:

a terminal for inputting and outputting an electronic signal;

an impedance increase means for increasing an impedance of an electrical connection between the electronic circuit and the peripheral circuit; and an inspection means for inspecting the electronic circuit, wherein the impedance increase means prevents inflow of an electric current from the peripheral circuit into the electronic circuit and/or outflow of the electric current from the electronic circuit to the peripheral circuit before inspection of the electronic circuit by the inspection means, the inspection means inspects the electronic circuit by electrically coupling the terminal with the electronic circuit and by performing input and output of inspection signal between the inspection means and the electronic circuit, and the impedance increase means electrically couples the electronic circuit with the peripheral circuit after the inspection.

* * * * *